US010559355B2

(12) United States Patent
Harrand et al.

(10) Patent No.: US 10,559,355 B2
(45) Date of Patent: Feb. 11, 2020

(54) DEVICE AND METHOD FOR WRITING DATA TO A RESISTIVE MEMORY

(71) Applicant: Commissariat à l'énergie atomique et aux énergies alternatives, Paris (FR)

(72) Inventors: Michel Harrand, Saint Egreve (FR); Elisa Vianello, Grenoble (FR); Olivier Thomas, Revel (FR); Bastien Giraud, Voreppe (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/848,265

(22) Filed: Sep. 8, 2015

(65) Prior Publication Data

US 2016/0071588 A1    Mar. 10, 2016

(30) Foreign Application Priority Data

Sep. 9, 2014 (FR) ..................................... 14 58426

(51) Int. Cl.
*G11C 13/00* (2006.01)
(52) U.S. Cl.
CPC ................................ *G11C 13/0069* (2013.01)
(58) Field of Classification Search
CPC .......................................... G11C 13/00–0097
USPC ....................................................... 365/148
See application file for complete search history.

(56) References Cited

U.S. PATENT DOCUMENTS

| 2007/0091667 | A1 | 4/2007 | Rohr et al. |
| 2010/0103726 | A1 | 4/2010 | Bae et al. |
| 2010/0271861 | A1 | 10/2010 | Kitagawa |
| 2011/0305066 | A1* | 12/2011 | Nazarian ............. G11C 13/0011 365/148 |
| 2012/0063195 | A1* | 3/2012 | Lam .................... G11C 11/5642 365/148 |
| 2013/0235651 | A1* | 9/2013 | Perner ................ G11C 13/0007 365/148 |
| 2013/0250657 | A1* | 9/2013 | Haukness .......... G11C 13/0069 365/148 |

(Continued)

OTHER PUBLICATIONS

Wong et al., Metal-Oxide RRAM, Jun. 2012, Proceedings of the IEEE, vol. 100, No. 6, p. 1952.*

(Continued)

*Primary Examiner* — Alfredo Bermudez Lozada
(74) *Attorney, Agent, or Firm* — Kaplan Breyer Schwarz, LLP

(57) ABSTRACT

The invention relates to a resistive memory (5) including resistive elements, the resistance of each resistive element being capable of alternating between a high value in a first range of values and a low value in a second range of values smaller than the high value, the memory further comprising a device (14) for switching the resistance of at least one resistive element selected from among the resistive elements between the high and low values, the device including a first circuit capable of applying an increasing voltage across the selected resistive element while the selected resistive element is at the high value or at the low value, a second circuit capable of detecting the switching of the resistance of the selected resistive element, and a third circuit capable of interrupting the current flowing through the selected resistive element on detection of the switching.

9 Claims, 8 Drawing Sheets

(56) References Cited

U.S. PATENT DOCUMENTS

2015/0248934 A1* 9/2015 Rabary .............. G11C 13/0069
365/148

OTHER PUBLICATIONS

"French Search Report", issued in French patent application No. 14/58426 dated May 12, 2015, Published in: FR.

Baek, et al., "A Reliable Cross-Point MLC ReRAM with Sneak Current Compensation", "Memory Workshop (IMW)", May 2015, pp. 1-4, Publisher: IEEE; ISBN: 978-1-4673-6931-2, Published in: U.S.

* cited by examiner

DEVICE AND METHOD FOR WRITING DATA TO A RESISTIVE MEMORY

BACKGROUND

The present application relates to a device and a method for writing data into a resistive memory.

DISCUSSION OF THE RELATED ART

Resistive memories are non-volatile memories comprising memory cells each having at least one resistive element capable of having at least two different resistance values, for example, a low value, noted Ron, and a high value, noted Roff. As an example, the resistive element may comprise an electrically-insulating material, data being stored in the resistive element by the presence or the absence of a continuous conductive filament in the electrically-insulating material. When the conductive filament is present, resistance Ron of the resistive element is low, while when the filament is broken or is absent, resistance Roff of the resistive element is high. The passing of the resistance of the resistance element of a memory cell from Ron to Roff and conversely is called switching of the memory cell.

The fact of switching the resistance of the resistive element of the memory cell from Roff to Ron is called a memory cell write operation. A write operation corresponds to the forming of the conductive filament in the resistive element of the memory cell. This may be obtained by applying a determined voltage for a determined time between a first terminal and a second terminal of the memory cell. The fact of switching the resistance of the resistive element of the memory cell from Ron to Roff is called memory cell delete operation. A delete operation corresponds to the breaking of the filament of the resistive element of the memory cell. For a bipolar memory cell, this may be obtained by applying a determined voltage for a determined time between the second terminal and the first terminal of the memory cell, that is, with a polarity inverted with respect to the write operation. For a unipolar memory cell, this may be obtained by applying a determined voltage having an amplitude different from that of the voltage applied during the write operation. An initialization operation should generally be provided before the first write operation to form the first filament by applying, between the first and second terminals, a higher voltage than that applied during a write operation. The operation of writing into a resistive memory thus corresponds to the performing of operations of writing into and/or deleting from memory cells of the resistive memory.

A disadvantage of resistive memories is that resistances Ron and Roff obtained after a write operation or a delete operation having a high variability from one memory cell to the other. Further, for a same memory cell, resistance Ron or Roff may vary for two successive write or delete operations. Thereby, the determination of the write or delete voltage and of the duration of application of this voltage is difficult. Indeed, if the write or delete voltage is too low and/or if the duration of application of this voltage is too short, certain memory cells may not switch. However, if the write or delete voltage is too high and/or if the duration of application of this voltage is too long, certain memory cells may deteriorate, which causes a decrease in the lifetime of such memory cells.

SUMMARY

An object of an embodiment is to overcome all or part of the disadvantages of previously-described devices for writing into and deleting from a resistive memory.

Another object of an embodiment is to increase the robustness of the resistive memory, particularly to decrease the dispersion of resistances Ron and Roff of the memory cells of the resistive memory.

Another object of an embodiment is to increase the reliability of the resistive memory, that is, to increase the life expectancy of memory cells and to limit the duration of application to the memory cells of excessive currents and voltages during read and write operations.

Another object of an embodiment is to improve the energetic efficiency of the resistive memory, that is, to decrease the power consumption of the resistive memory while applying conditions sufficient for the read and write operations to occur properly.

Thus, an embodiment provides a resistive memory comprising resistive elements, the resistance of each resistive element being capable of alternating between a high value in a first range of values and a low value in a second range of values smaller than the high value, the memory further comprising a device for switching the resistance of at least one resistive element selected from among the resistive elements between the high and low values, the device comprising a first circuit capable of applying an increasing voltage across the selected resistive element while the selected resistive element is at the high value or at the low value, a second circuit capable of detecting the switching of the resistance of the selected resistive element, and a third circuit capable of interrupting the current flowing through the selected resistive element on detection of the switching.

According to an embodiment, the device comprises a fourth circuit for supplying a first increasing voltage, the second circuit being capable of comparing the first voltage with a second voltage which varies according to the resistance of the selected resistive element.

According to an embodiment, the second voltage is proportional to the first voltage with a proportionality factor which varies according to the resistance of the selected resistive element.

According to an embodiment, the second circuit is capable of detecting that the difference between the first voltage and the second voltage changes sign.

According to an embodiment, the memory comprises a fifth circuit for supplying a third increasing voltage and a voltage divider comprising, in series, at least one resistive component and the selected resistive element, the third voltage being applied across the voltage divider, the second voltage being measured at a node of the voltage divider between the resistive component and the selected resistive element.

According to an embodiment, the fourth circuit comprises additional resistive elements assembled in series and in parallel.

According to an embodiment, the second circuit comprises a comparator receiving the first voltage and the second voltage and providing a binary signal which depends on the sign of the difference between the first voltage and the second voltage.

According to an embodiment, the voltage divider further comprises a switch controlled by the binary signal or a signal derived from the binary signal.

An embodiment also provides a method of controlling a resistive memory comprising resistive elements, the resistance of each resistive element being capable of alternating between a high value in a first range of values and a low value in a second range of values smaller than the high value, for the switching of the resistance of at least one resistive element selected from among the resistive elements between the high and low values, the method comprising the steps of:

applying an increasing voltage across the selected resistive element while the selected resistive element is at the high value or at the low value;

detecting the switching of the resistance of the selected resistive element; and interrupting the current flowing through the selected resistive element on detection of the switching.

According to an embodiment, the method further comprises the steps of:

supplying a first increasing voltage; and comparing the first voltage with a second voltage which varies according to the resistance of the selected resistive element.

According to an embodiment, the second voltage is proportional to the first voltage with a proportionality factor which varies according to the resistance of the selected resistive element.

According to an embodiment, the method further comprises detecting that the difference between the first voltage and the second voltage changes sign.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
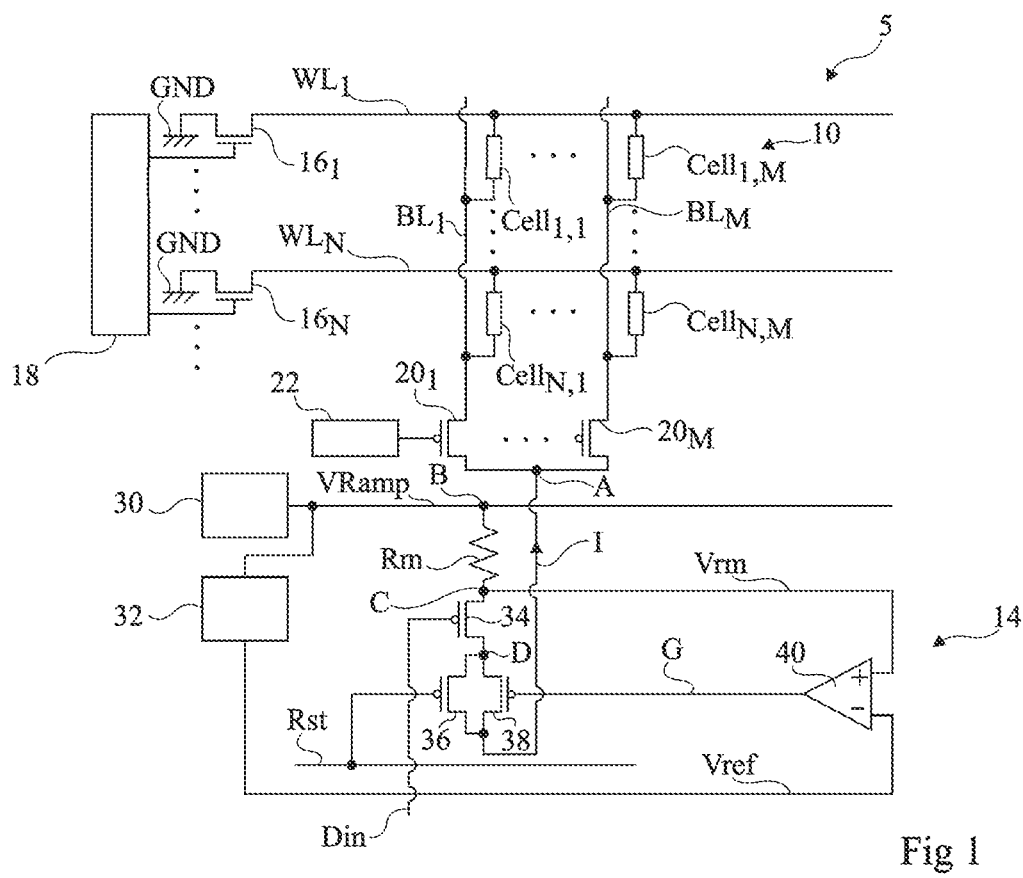
FIG. 1 is an electric diagram of an embodiment of a device for deleting from a resistive memory.

For clarity, the same elements have been designated with the same reference numerals in the different drawings. In the following description, expressions "substantially", "around", and "approximately" mean "to within 10%".

In the following description, a signal which alternates between a first constant state, for example, a low state, noted "0", and a second constant state, for example, a high state, noted "1", is called "binary signal". In practice, the binary signals may correspond to voltages or to currents which may not be perfectly constant in the high or low state. The high and low states of binary signals of a same electronic circuit may be different.

According to an embodiment, an operation of writing into a memory cell of a resistive memory and/or of deleting from the memory cell is carried out as follows:

application of an increasing voltage or current across the memory cell;

detection of the memory cell switching; and automatic cutting of the current flowing through the memory cell after the detection.

For each memory cell, the switching of the memory cell occurs when the voltage applied thereacross reaches the voltage necessary for its switching. The switching voltage may thus be different from one memory cell to the other. The memory cell lifetime is advantageously increased since each memory cell is not submitted longer than necessary to the voltage or to the current enabling it to switch. Further, the power consumption of the resistive memory is decreased since the current supplying each memory cell is interrupted as soon as the memory cell has switched.

FIG. 1 shows an embodiment of a resistive cell 5 comprising an array 10 of memory cells $Cell_{i,j}$, for example, with N rows and M columns, where N and M are integers greater than 2 and where i is an integer varying from 1 to N and j is an integer which varies from 1 to M. Memory 5 further comprises a device 14 for deleting from memory cells $Cell_{i,j}$.

Each memory cell $Cell_{i,j}$ comprises first and second terminals. For each row of array 10, the first terminals of the memory cells $Cell_{i,j}$ in the row are connected to a word line $WL_i$. For each column of array 10, the second terminals of the memory cells $Cell_{i,j}$ in the column are connected to a bit line $BL_j$. Each word line $WL_i$, with i varying from 1 to N, is connected to a source of a low reference potential, for example, ground GND, via a switch $16_i$. Switches $16_i$ are controlled by a word line selection unit 18. As an example, each switch $16_i$ corresponds to a metal-oxide gate field-effect transistor, or MOS transistor, for example, with an N channel, having its drain is connected to word line $WL_i$, having its source connected to ground GND and having its gate controlled by unit 18. Each bit lines $BL_j$, with j varying from 1 to M, is connected to a switch $20_j$. Switches $20_j$ are controlled by a bit line selection unit 22. As an example, each switch $20_j$ corresponds to a MOS transistor, for example, with a P channel, having its drain connected to bit line $BL_j$, having its source connected to a node A, and having its gate controlled by unit 22.

As an example, each memory cell $Cell_{i,j}$ may comprise a resistive element where a conductive filament may be formed, in series with a non-linear component. According to another example, each memory cell $Cell_{i,j}$ may comprise a resistive element in series with a MOS transistor. In this case, the gate of the MOS transistor may be connected to word line $W_i$, one of the terminals of memory cell $Cell_{i,j}$ being connected to bit line $BL_j$ and the other terminal of memory cell $Cell_{i,j}$ being connected to a source of a variable potential.

Delete device 14 comprises a circuit 30 for providing an increasing voltage VRamp at a node B and a circuit 32 receiving voltage VRamp and delivering an increasing reference voltage Vref smaller than voltage VRamp. As an example, circuit 30 is capable of providing a voltage ramp, that is, voltage VRamp is a function linearly increasing along time. As a variation, the first time derivative of voltage VRamp decreases along time. As an example, voltage VRamp successively comprises a first ramp and a second ramp, the first time derivative of voltage VRamp for the second ramp being smaller than the first time derivative of voltage VRamp for the first ramp.

According to an embodiment, voltage Vref is proportional to voltage VRamp with a proportionality ratio smaller than 1.

Delete device 14 comprises a resistor Rm between node B and a node C. Resistor Rm may be formed by a polysilicon track. Call Vrm the voltage between node C and ground GND. A switch 34 controlled by a binary signal Din is provided between node C and a node D. Two switches 36 and 38, assembled in parallel, are provided between nodes D and A. Switch 36 is controlled by a binary signal Rst and switch 38 is controlled by a binary signal G. As an example, each switch 34, 36, 38 is on when the associated control signal is in a first state, for example, in the low state, and is off when the associated control signal is in a second state, for example, in the high state. According to an embodiment, each switch 34, 36, 38 corresponds to a P-channel MOS transistor having its gate controlled by the associated control signal.

Delete device 14 comprises an operational amplifier 40, assembled as a comparator, having its non-inverting input (+) connected to node C and receiving voltage Vrm and having its inverting input (−) connected to circuit 32 and receiving voltage Vref. Comparator 40 provides signal G. As an example, signal G is at "0" when voltage Vrm is smaller than voltage Vref and is at "1" when voltage Vrm is greater than voltage Vref.

When a memory cell $Cell_{i,j}$ is selected for a delete operation, memory cell $Cell_{i,j}$ and resistor Rm form a voltage dividing bridge. Voltage Vrm is provided by the following relation (1):

$$Vrm = \frac{RCell}{RCell + Rm} VRamp \quad (1)$$

where Rcell is the resistance of the selected memory cell $Cell_{i,j}$ and is equal to Ron or Roff.

Resistance Rm is selected so that voltage Vrm is sufficiently high to be measurable and not too high to avoid hindering memory cell write or delete operations or imposing too high a voltage Vramp. As an example, resistance Rm may be substantially equal to Ron/10. Then, voltage Vref is selected so that, when the resistance of the resistive element of the selected memory cell $Cell_{i,j}$ is equal to Roff, voltage Vrm is smaller than voltage Vref and, when the resistance of the resistive element of memory cell $Cell_{i,j}$ is equal to Ron, voltage Vrm is greater than voltage Vref.

Memory array 10 may be divided into a plurality of column groups. The columns of each group of columns may be connected to different nodes A and delete device 14 may be partially duplicated for each group of columns. More specifically, resistor Rm, switches 34, 36, 38, and comparator 40 are repeated for each group of columns and circuits 30 and 32 may be common to all the columns groups.

Figure 2:
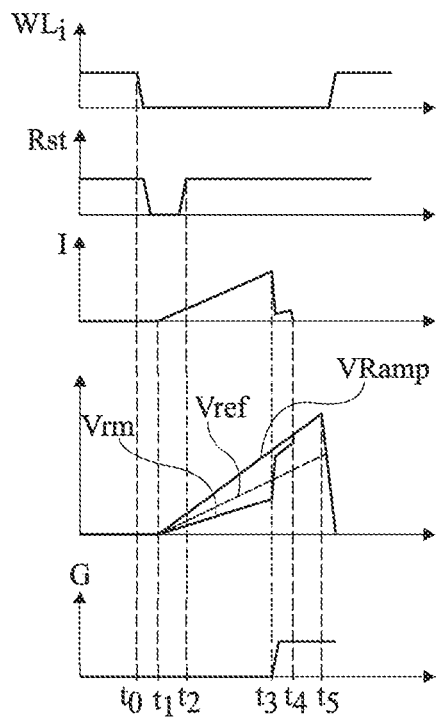
FIG. 2 shows timing diagrams of signals implemented by the device of FIG. 1 during a delete operation.

FIG. 2 shows timing diagrams of signals implemented by memory 5 of FIG. 1 during a delete operation. Times $t_0$ to $t_5$ are successive times.

At time $t_0$, memory cell $Cell_{i,j}$ where a delete operation should be performed is selected. This is obtained by connecting word line $WL_i$ to ground GND and by turning on transistor $20_j$. Further, signal Rst is set to "0", which turns on transistor 36. Signal Din is at "0" when a delete operation should be performed in the selected memory cell. Transistor 34 is then conductive.

At time $t_1$, voltage VRamp starts increasing from the zero value. Voltages Vref and Vrm thus start increasing. Further, a current I starts flowing through the selected memory cell $Cell_{i,j}$. The resistance of the resistive element of memory cell $Cell_{i,j}$ being equal to Ron, voltage Vrm is smaller than voltage Vref. Signal G delivered by comparator 40 is at "0" as soon as the difference between voltages Vrm and Vref is sufficient. Since the value of signal G may be uncertain as long as voltages Vrm and Vref are not sufficiently different, transistor 36, which is conductive, enables to provide a conduction path between nodes A and D until it is certain that signal G is at "0".

At time $t_2$, signal Rst switches from "0" to "1". Transistor 36 switches to the off state.

At time $t_3$, the voltage applied to memory cell $Cell_{i,j}$ is sufficiently high to cause the switching of the memory cell. The resistance of the resistive element of memory cell $Cell_{i,j}$ switches from Ron to Roff. Voltage Vrm then rises above Vref. Current I decreases.

At time $t_4$, signal G provided by comparator 40 switches to "1". Transistor 38 switches to the off state. Current I cancels and no voltage is applied to memory cell $Cell_{i,j}$ any longer.

A time $t_5$, circuit 30 interrupts the supply of voltage VRamp, for example, after a determined time.

As a variation, transistor 36 may be omitted. Delete device 14 may then comprise means for ensuring that signal G is at "0" at the beginning of a delete operation. As an example, delete device 14 may comprise a storage element of flip-flop type between comparator 40 and transistor 38.

Figure 3:
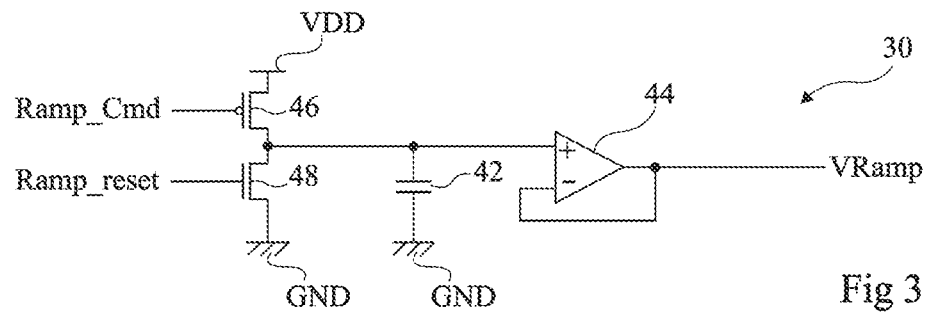
FIGS. 3 to 6 are electric diagrams of embodiments of portions of the delete device of FIG. 1.

FIG. 3 shows an embodiment of circuit 30 for supplying voltage VRamp. In this embodiment, circuit 30 comprises a capacitor 42 having an electrode connected to ground GND and having its other electrode connected to the non-inverting input (+) of a follower-assembled operational amplifier 44. The inverting input (−) of operational amplifier 44 is connected to the output of operational amplifier 44. Operational amplifier 44 supplies voltage VRamp. Circuit 30 further comprises a P-channel MOS transistor 46 and an N-channel MOS transistor 48. The source of transistor 46 is connected to a source of a high potential VDD. The drains of transistors 46 and 48 are connected to the non-inverting input (+) of operational amplifier 44. The source of transistor 48 is connected to ground GND. The gate of the MOS transistor receives a binary signal Ramp_Cmd and the gate of transistor 48 receives a binary signal Ramp_reset.

Circuit 30 of FIG. 3 operates as follows. Capacitor 42 is discharged by turning on transistor 48, transistor 46 being off. Transistor 48 is then turned on and transistor 46 is off. The conduction properties of transistor 46 are selected so that the charge of capacitor 42 is progressive. The voltage across capacitor 42 corresponds to voltage VRamp. Operational amplifier 44 copies voltage Vramp.

Figure 4:
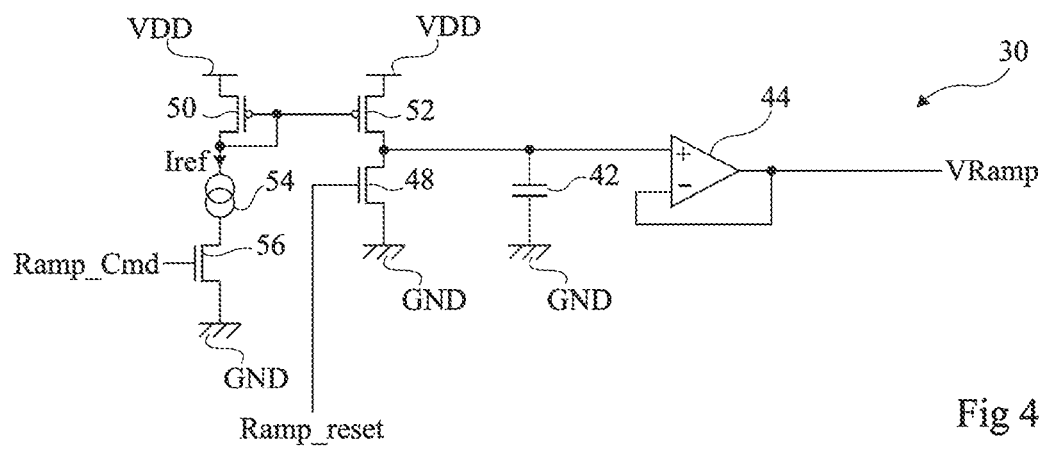

FIG. 4 shows another embodiment of circuit 30 for delivering voltage VRamp. In this embodiment, instead of transistor 46, a current mirror comprising two P-channel MOS transistors 50 and 52, a current source 54 delivering a current Iref, and an N-channel MOS transistor 56 are provided. The sources of transistors 50 and 52 are connected to the source of potential VDD. The drain of transistor 52 is connected to the non-inverting input (+) of operational amplifier 44. The gate of transistor 50 is connected to the gate of transistor 52, to the drain of transistor 50, and to a terminal of current source 54. The other terminal of current source 54 is connected to the drain of transistor 56 and the source of transistor 56 is connected to ground GND.

The current mirror copies current Iref delivered by current source 54 with a multiplication factor equal to the ratio between the gate widths of transistors 52 and 50. When transistor 56 is on and transistor 48 is off, capacitor 42 is charged at constant current with the current copied by the current mirror. The embodiment shown in FIG. 4 enables to obtain a more linear ramp and to better control the duration of the ramp with respect to the embodiment shown in FIG. 3.

Figure 5:
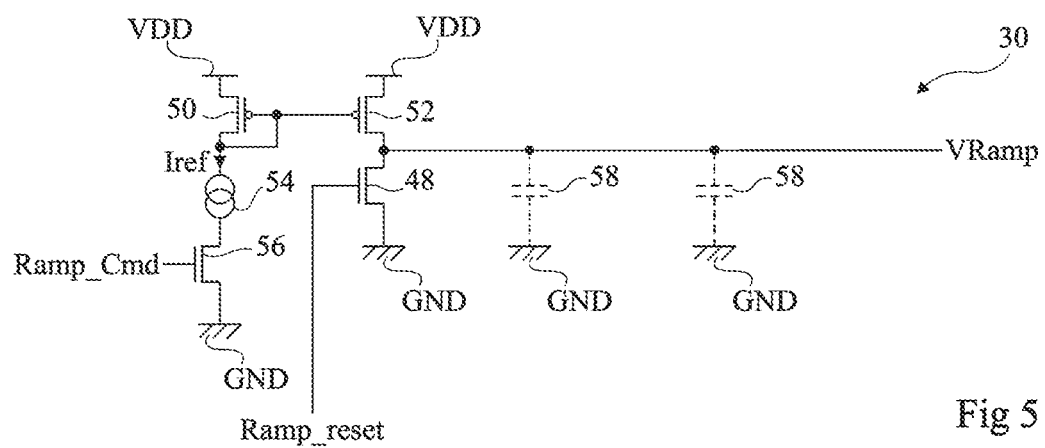

FIG. 5 shows another embodiment of circuit 30 for delivering voltage VRamp. As compared with the embodiment shown in FIG. 4, capacitor 42 and operational amplifier 44 are not present. The function of capacitor 42 is fulfilled in the present embodiment by the stray capacitance, illustrated in FIG. 5 by capacitors 58 shown in dotted lines, of the conductive track which transmits voltage VRamp.

Figure 6:
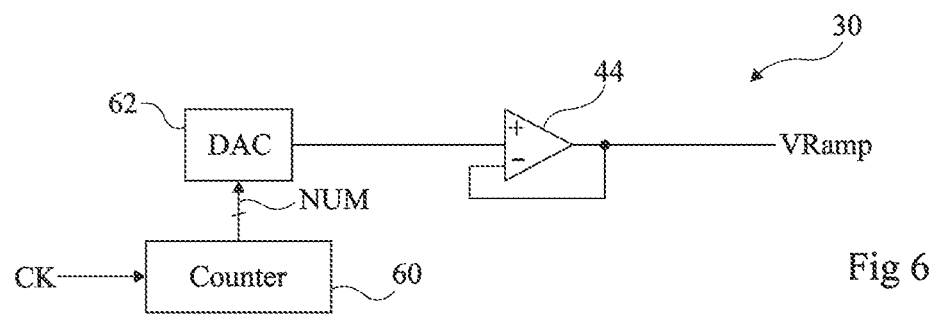

FIG. 6 shows another embodiment of circuit 30 for supplying voltage VRamp. In this embodiment, circuit 30 comprises a counter 60 (Counter) rated by a clock signal CK and delivering a digital signal NUM coded over a plurality of bits. Signal NUM is received by a digital-to-analog converter 62 (DAC) which converts digital signal NUM into an analog signal delivered to the non-inverting input (+) of operational amplifier 44. The increase rate of signal VRamp is determined by the frequency of clock signal CK and the number of bits of signal NUM. As a variation, a low-pass filter may be interposed between digital-to-analog converter 62 and operational amplifier 44 to smooth voltage VRamp. In practice, the low-pass filter function may be fulfilled by operational amplifier 44 and the stray capacitance of the conductive track transmitting voltage VRamp.

Figure 7:
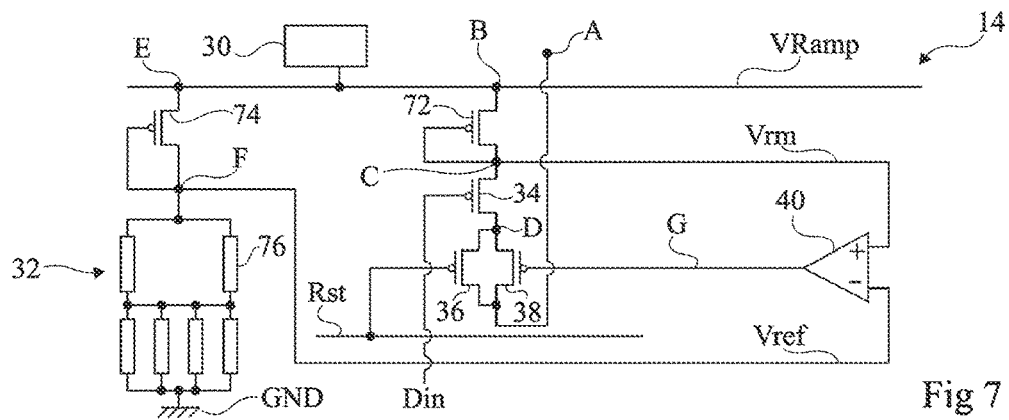
FIGS. 7 and 8 are partial electric diagrams of other embodiments of a resistive memory delete device.

FIG. 7 shows a more detailed embodiment of delete device 14 where resistor Rm is formed of a diode-assembled P-channel MOS transistor 72. The source of transistor 72 is connected to node B, the drain and the gate of transistor 72 being connected to node C.

Circuit 32 for delivering voltage Vref comprises a diode-assembled P-channel MOS transistor 74 between a node E and a node F. Node E receives voltage VRamp. The source of transistor 74 is connected to node E, the drain and the gate of transistor 74 being connected to node F. Preferably, transistor 74 is identical to transistor 72. When resistor Rm is formed by a polysilicon track, MOS transistor 74 is preferably replaced with an identical polysilicon resistor.

Circuit 32 further comprises, between node F and ground GND, an assembly of memory cells 76 assembled in series and in parallel so that equivalent resistance Req of the assembly of memory cells 76 is smaller than Roff. As an example, an assembly of six memory cells 72, each having a resistance Roff, is shown in FIG. 7 and the memory cells of this assembly are arranged so that equivalent resistance Req of the assembly of memory cells 76 is equal to ¾*Roff. As a variation, memory cells 76 each having a resistance Ron may be used. Circuit 32 may further comprise, in series with the assembly of memory cells 76, a resistance representative of the parasitic resistances on bit line $BL_j$ and word line $WL_i$ on selection of memory cell $Cell_{i,j}$. Since memory cells 76 are series-connected, each memory cell 76 does not see a sufficiently high voltage to switch. Circuit 32 plays the role of a voltage divider. Voltage Vref is provided by the following relation (2):

$$Vref = \frac{Req}{Req + Rm} VRamp \quad (2)$$

Figure 8:
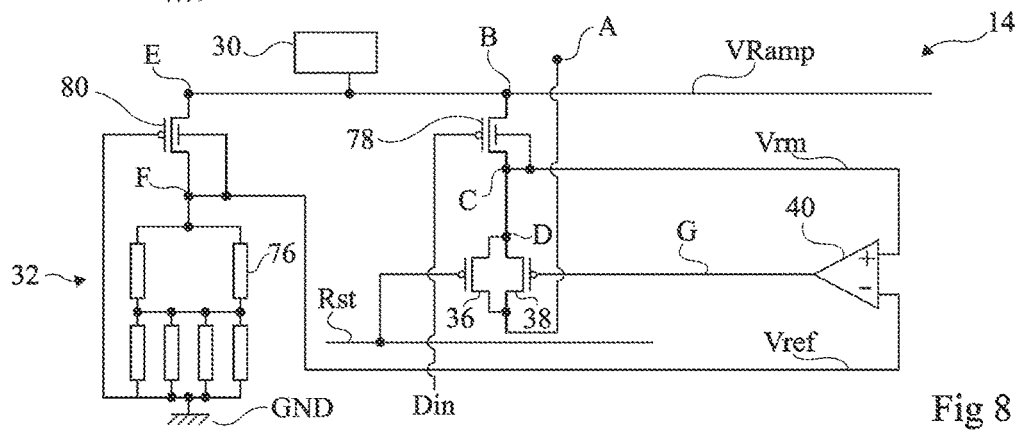

FIG. 8 shows another more detailed embodiment of delete device 14 where resistor Rm and transistor 34 shown in FIG. 1 are replaced with a P-channel MOS transistor 78 having its source connected to node B, having its drain connected to node D, having its gate receiving signal Din, and having its substrate connected to the drain. This means that, in the case where the substrate of transistor 78 corresponds to an N-type doped region where P-type doped regions corresponding to the drain and to the source of transistor 78 are formed, the drain and the substrate are substantially taken to the same potential.

The embodiment shown in FIG. 8 advantageously enables to suppress one of MOS transistors 72 and 34 with respect to the embodiment shown in FIG. 7. Since the substrate and the drain of transistor 78 are interconnected, the threshold voltage of transistor 78 is all the smaller as voltage Vrm is low. Thereby, it is avoided to lose the threshold voltage of diode-assembled transistor 72 in voltage VRamp. A lower voltage VRamp may thus be used, which enables to decrease the electric power consumption of delete device 14.

Preferably, circuit 32 for supplying voltage Vref, shown in FIG. 8, comprises, instead of transistor 74 shown in FIG. 7, a P-channel MOS transistor 80 identical to transistor 78, having its source connected to node E, having its drain connected to node F, having its gate connected to ground GND, and having its substrate connected to the drain.

Figure 9:
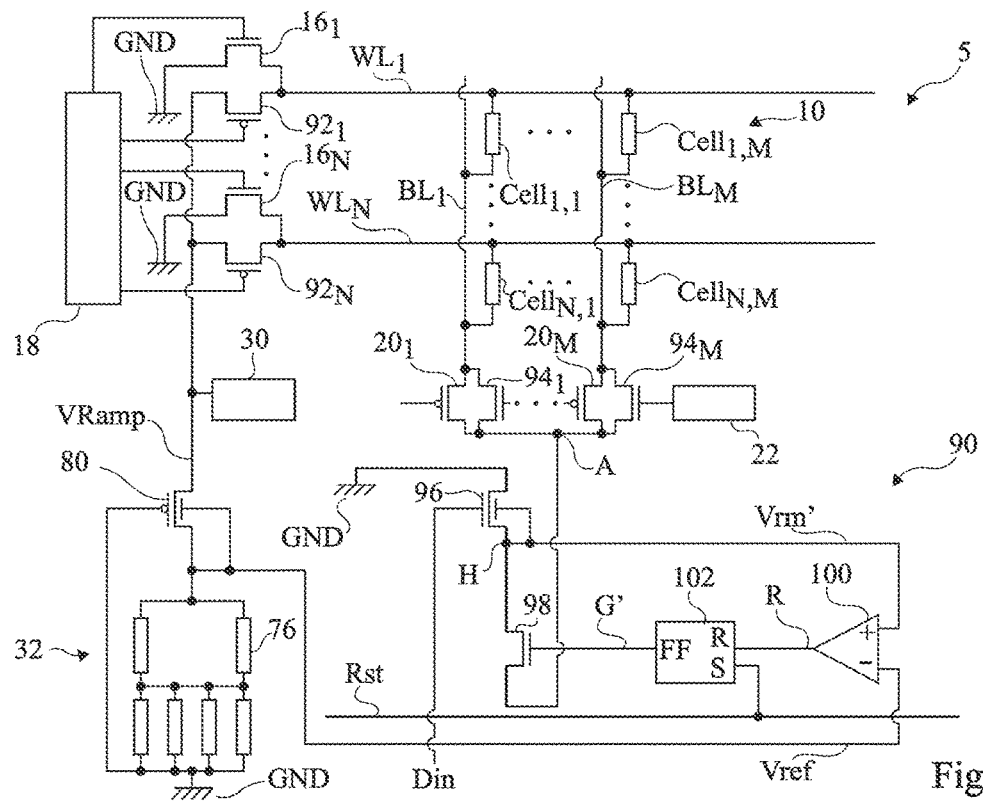
FIG. 9 is an electric diagram of an embodiment of a device for writing into a resistive memory.

FIG. 9 shows an embodiment of memory 5 where memory 5 comprises a device 90 for writing into memory cells $Cell_{i,j}$, that is, capable of having the resistance of the resistive element of a memory cell $Cell_{i,j}$ switch from Roff to Ron. The elements common with delete device 14 shown in FIG. 1 are designated with the same reference numerals.

Each word line $WL_i$, with i ranging from 1 to N, is connected to circuit 30 for supplying voltage VRamp via a switch $92_i$. Switches $92_i$ are controlled by word line selection unit 18. As an example, each switch 92 corresponds to a P-channel MOS transistor having its drain connected to word line $WL_i$, having its source connected to circuit 30, and having its gate controlled by unit 18. Each bit line $BL_j$, with j varying from 1 to M, is connected to node A via a switch $94_j$. Switches 94 are controlled by bit line selection unit 22. As an example, each switch $94_j$ corresponds to an N-channel MOS transistor, having its drain connected to bit line $BL_j$, having its source connected to node A, and having its gate controlled by unit 22.

Write device 90 comprises an N-channel MOS transistor 96 having its source connected to ground GND, having its drain connected to a node H, having its gate receiving signal Din, and having its substrate connected to the drain. Call Rm' the equivalent resistance of transistor 96. Call Vrm' the voltage between node H and ground GND. A switch 98 is assembled between nodes H and A. Switch 98 is controlled by a binary signal G'. As an example, switch 98 corresponds to an N-channel MOS transistor, having its source connected to node H, having its drain connected to node A, and having its gate controlled by signal G'.

Write device 90 further comprises an operational amplifier 100, assembled as a comparator, having its non-inverting input (+) connected to node H and receiving voltage Vrm' and having its inverting input (−) connected to circuit 32 and receiving voltage Vref. Comparator 100 provides a binary signal R. As an example, signal R is at "0" when voltage Vrm' is smaller than voltage Vref and is at "1" when voltage Vrm' is greater than voltage Vref.

Write device 90 further comprises a flip-flop type storage element 102, which delivers signal G'. Flip-flop 102 comprises an S control input receiving binary signal Rst and a R reset input receiving signal R. Conventionally, when signal Rst on the S control input switches from "0" to "1", output G' of flip-flop 102 is set to "1". When signal R on the R reset input switches from "0" to "1", output G' of flip-flop 102 switches to "0". When signal R on the R reset input switches from "1" to "0" or when signal Rst on the S control input switches from "1" to "0", output G' of flip-flop 102 is not modified.

When a memory cell $Cell_{i,j}$ is selected for a write operation, memory cell $Cell_{i,j}$ and equivalent resistor Rm' of MOS transistor 96 form a voltage dividing bridge. Voltage Vrm' is provided by the following relation (3):

$$Vrm' = \frac{Rm'}{RCell + Rm'} VRamp \quad (3)$$

Figure 10:
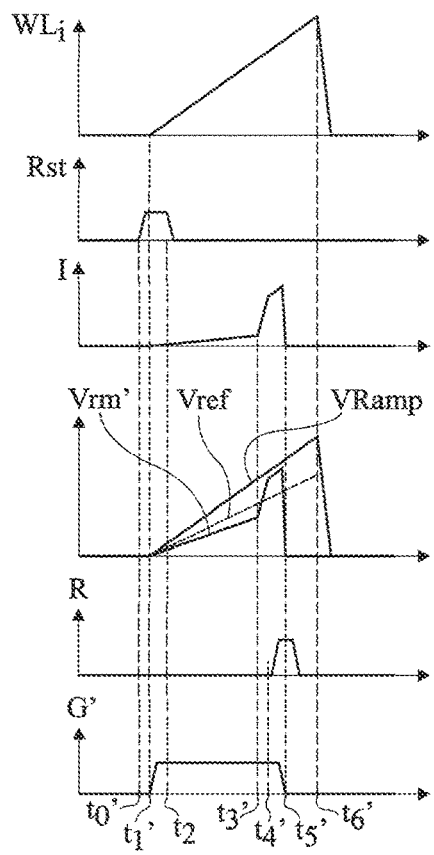
FIG. 10 shows timing diagrams of signals implemented by the device of FIG. 9 during a write operation.

FIG. 10 shows timing diagrams of signals implemented by memory 5 of FIG. 9 during a write operation. Times $t'_0$ to $t'_6$ are successive times.

At time $t'_0$, signal Rst switches to "1", which causes the setting to "1" of output signal G' of flip-flop 102. Transistor 98 thus turns on. Signal Din is at "1" when a write operation should be performed in the selected memory cell. Transistor 96 is then conductive.

At time $t'_1$, voltage VRamp starts increasing from the zero value. Voltages Vref and Vrm' thus start increasing. Further, a current I starts flowing through the selected memory cell $Cell_{i,j}$. The resistance of memory cell $Cell_{i,j}$ being equal to Roff, voltage Vrm' is smaller than voltage Vref. Signal R output by comparator 100 is at "0". However, output G' of the flip-flop remains at "1".

At time $t'_2$, signal Rst switches from "1" to "0". Output signal G' of flip-flop 102 is however not modified.

At time $t'_3$, the voltage applied to memory cell $Cell_{i,j}$ is sufficiently high to cause the switching of the memory cell. The resistance of the resistive element of memory cell $Cell_{i,j}$ switches from Roff to Ron. Voltage Vrm' then rises above Vref. Current I decreases and signal R output by comparator 100 switches to "1".

At time $t'_5$, flip-flop 102 receiving signal R sets signal G' to "0". Switch 98 switches to the off state. Current I cancels and no voltage is applied to memory cell $Cell_{i,j}$ any longer. During its drop, voltage Vrm' becomes smaller than voltage Vref and signal R' switches to "0". However, signal G' is maintained at "0".

At time $t'_6$, circuit 30 interrupts the supply of voltage VRamp.

In the embodiment shown in FIG. 9, to perform a write operation, bit line $BL_j$ connected to the selected memory cell $Cell_{i,j}$ is set to ground GND and word line $WL_i$ connected to the selected memory cell $Cell_{i,j}$ receives voltage VRamp. This advantageously enables to use the same circuit 30 for a write operation and for a delete operation. According to another embodiment, to perform a delete operation, word line $WL_i$ connected to the selected memory cell $Cell_{i,j}$ may be set to high potential VDD and bit line $BL_j$ connected to the selected memory cell $Cell_{i,j}$ may receive a voltage continuously decreasing, for example, from VDD to 0 V.

According to an embodiment, memory 5 may comprise delete device 14 shown in FIG. 1 and write device 90 shown in FIG. 9. In this case, circuits 30 and 32 may be common to the write and delete devices. Further, in the case where delete device 14 also comprises a flip-flop, flip-flop 102 and operational amplifier 100 may be common to delete device 14 and to write device 90.

According to another embodiment, an operation of writing into a memory cell of a resistive memory and/or of deleting from the memory cell is carried out as follows:
- circulating of a current through the memory cell;
- comparison of the voltage across the memory cell with a reference voltage;
- detection of the switching of the memory cell from the comparison of the voltage across the memory cell with the reference voltage; and
- automatic cutting of the current flowing through the memory cell after the detection.

For each memory cell, the power consumption of the memory cell is decreased since the current supplying each memory cell is interrupted as soon as the memory cell has switched. The memory cell lifetime is advantageously preserved since the memory cell is not submitted to the switching voltage longer than necessary. Further, the current flowing through the memory cell is interrupted when the voltage across the memory cell reaches a determined voltage, that is, when the resistance of the memory cell reaches a determined resistance. Advantageously, resistances Ron of the memory cells after a write operation are substantially equal and resistances Roff of the memory cells after a delete operation are substantially equal.

The operating principle of a write device and of a delete device will first be described for a write or delete operation for a single memory cell. This is followed by the description of the use of the write device and of the delete device with a resistive memory comprising a plurality of memory cells.

Figure 11:
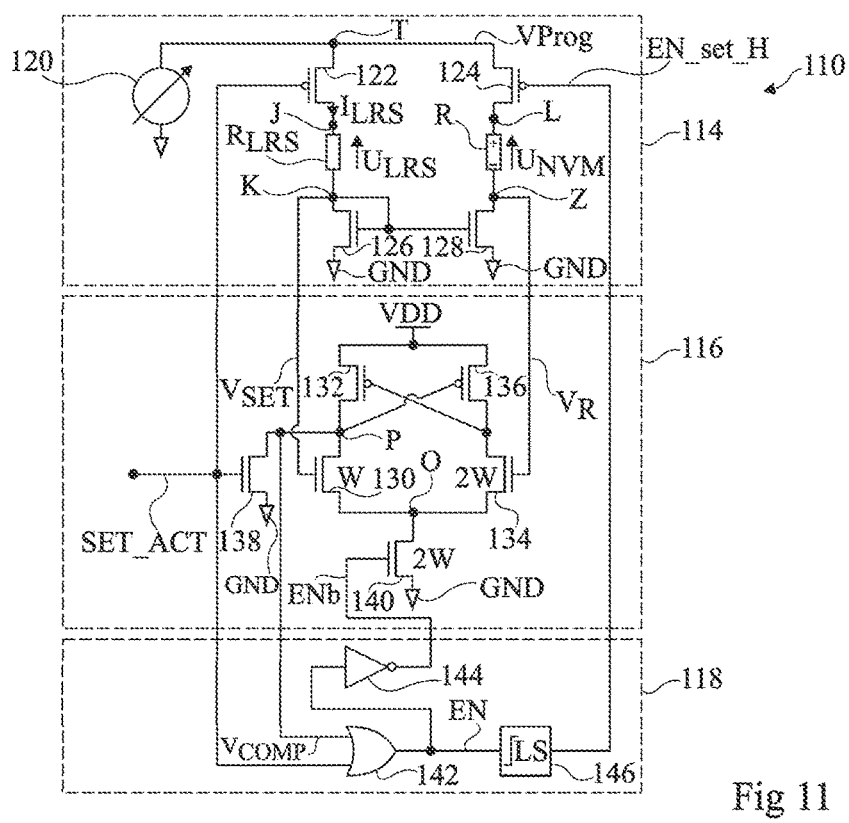
FIG. 11 is an electric diagram of another embodiment of a device for writing into a memory cell of a resistive memory.

FIG. 11 shows another embodiment of a device 110 for writing into a resistive element R of a memory cell. Write device 110 comprises a programming circuit 114, an end-of writing detection circuit 116 and a logic feedback circuit 118.

Programming circuit 114 comprises a circuit 120 for providing a programming voltage VProg to a node T. Voltage VProg may be a constant voltage or a stepped monotonous voltage, for example, continuously increasing, for example, a voltage ramp, for part of a write or delete operation, for example the beginning of a write or delete operation at least until the switching of the memory cell, and then decreasing at the end of the write or delete operation. Circuit 120 may have the same structure as previously-described circuit 30. Programming circuit 114 further comprises a reference resistor $R_{LRS}$ between nodes J and K and a switch 122 controlled by a binary signal SET_ACT between node T and node J. Switch 122 may correspond to a P-channel MOS transistor having its source connected to node T, having its drain connected to node J, and having its gate receiving signal SET_ACT. According to an embodiment, reference resistance $R_{LRS}$ is substantially equal to the resistance level Ron desired for resistive element R. Resistor $R_{LRS}$ may be formed by a polysilicon track.

Resistive element R is placed between nodes L and Z. Programming circuit 114 comprises a switch 124 controlled by a binary signal EN_set_H between node T and node L. Switch 124 may correspond to a P-channel MOS transistor having its source connected to node T, having its drain connected to node L, and having its gate receiving signal EN_set_H.

Programming circuit 114 comprises a current mirror which copies the current flowing through resistor $R_{LRS}$ in resistive element R. The current mirror for example comprises a diode-assembled N-channel MOS transistor 126, having its drain connected to node K, having its source connected to ground GND, and having its gate connected to the drain. The current mirror further comprises an N-channel MOS transistor 128, having its drain connected to node Z, having its source connected to ground GND, and having its gate connected to the gate of transistor 126. Call $V_{SET}$ the voltage between node K and ground GND and $V_R$ the voltage between node Z and ground GND.

Detection circuit 116 is capable of comparing voltages $V_{SET}$ and $V_R$. It comprises an N-channel MOS transistor 130 having its source connected to a node O, having its drain connected to a node P, and having its gate connected to node K and receiving voltage $V_{SET}$. Call $V_{comp}$ the voltage between node P and ground GND. Node P is connected to the drain of a P-channel MOS transistor 132. Detection circuit 116 further comprises an N-channel MOS transistor 134 having its source connected to node O, having its drain connected to the drain of a P-channel MOS transistor 136, and having its gate connected to node Z and receiving voltage $V_R$. The sources of MOS transistors 132 and 136 are connected to a source of a high reference potential VDD. The gate of transistor 132 is connected to the drain of transistor 136 and the gate of transistor 136 is connected to the drain of transistor 132. Preferably, the gate width of transistor 134 is larger than the gate width of transistor 130. As an example, the gate width of transistor 134 is equal to twice the gate width of transistor 130.

Detection circuit 116 comprises, between node P and ground GND, a switch 138 controlled by binary signal SET_ACT. Switch 138 may correspond to an N-channel MOS transistor having its source connected to ground GND, having its drain connected to node P, and having its gate receiving signal SET_ACT. Detection circuit 116 further comprises, between node O and ground GND, a switch 140 controlled by a binary signal ENb. Switch 140 may correspond to an N-channel MOS transistor having its source connected to ground GND, having its drain connected to node O, and having its gate receiving signal ENb. The gate width of transistor 140 may be equal to the sum of the gate width of transistor 134 and of the gate width of transistor 130.

Logic circuit 118 comprises a block 142 carrying out the "OR" logic function, receiving signals $V_{COMP}$ and SET_ACT and delivering a binary signal EN. Logic circuit 118 further comprises a block 144 carrying out the "NO" logic function, receiving signal EN and delivering signal ENb. Logic circuit 118 may further comprise a level conversion circuit 146 receiving signal EN and delivering signal EN_set_H. The high state of signal EN_set_H is at a voltage greater than the high state of signal EN and is capable of controlling certain MOS transistors. As an example, the high state of signal EN_set_H corresponds to VProg. As a variation, circuit 146 may be absent.

According to an embodiment, device 110 may further comprise a voltage converter receiving signal SET_ACT and having its output connected to the gate of transistor 138 and to the gate of transistor 122.

Write device 110 operates as follows. Before the beginning of a write operation, signal SET_ACT is at "1". Transistor 138 is thus conductive, which maintains voltage $V_{COMP}$ at "0". Further, transistor 122 is off. No current flows through resistor $R_{LRS}$. Signal EN is at "1" and signal ENb is at "0". Transistor 140 is thus off. Signal EN_set_H is at "1". Transistor 124 is thus off. No current flows through resistive element R.

At the beginning of a write operation, signal SET_ACT is set to "0". Transistor 122 thus becomes conductive. Since signal $V_{COMP}$ is at "0", signal EN switches to "0" and signal ENb switches to "1". Transistor 140 thus becomes conductive. Signal EN_set_H switches to "0". Transistor 124 thus becomes conductive. Circuit 120 supplying programming voltage VProg causes the flowing of a current $I_{LRS}$ through resistor $R_{LRS}$. Current $I_{LRS}$ is copied by the current mirror and flows through resistive element R. Since the resistance of resistive element R can be assumed to be equal to Roff, that is, greater than $R_{LRS}$, voltage $U_{NVM}$ across resistive element R is greater than voltage $U_{LRS}$ across resistor $R_{LRS}$. Since the drain-source voltages of transistors 122 and 124 are identical and substantially zero, voltage $V_R$ is smaller than voltage $V_{SET}$. Transistor 130 is thus more conductive than transistor 134. Signal $V_{COMP}$ remains at "0", transistor 136 being conductive and transistor 132 being off.

When resistive element R switches, the resistance of resistive element R decreases. When the resistance of resistive element R becomes substantially equal to $R_{LRS}$, voltage $U_{NVM}$ becomes substantially equal to voltage $U_{LRS}$ and voltage $V_R$ becomes substantially equal to $V_{SET}$. Since the gate width of transistor 134 is greater than the gate width of transistor 130, transistor 134 is more conductive than transistor 130. This causes a switching of $V_{COMP}$ from "0" to "1", transistor 132 becoming conductive and transistor 136 turning off. Signal EN, and thus signal EN_set_H, then switch from "0" to "1". Transistor 124 is turned off, interrupting the current flow in resistive element R. Further, signal ENb switches from "1" to "0", thus turning off transistor 140.

According to another embodiment, the gate width of transistor 134 may not be larger than the gate width of transistor 130. In this case, reference resistance $R_{LRS}$ is greater than the desired resistance Ron. When resistive element R switches, the resistance of resistive element R decreases from Roff to Ron. When the resistance of resistive element R becomes smaller than resistance $R_{LRS}$, voltage $U_{NVM}$ becomes smaller than voltage $U_{LRS}$ and voltage $V_R$ becomes greater than $V_{SET}$. Transistor 134 is more conductive than transistor 130. This causes a switching of $V_{COMP}$ from "0" to "1".

For each memory cell, the current flowing through the memory cell is interrupted as soon as the memory cell has switched. The memory cell lifetime is advantageously preserved since the memory cell is not submitted longer than necessary to the voltage and to the current enabling it to switch. Further, the memory cell power consumption during a write operation is decreased. Further, in the present embodiment, the current flow in resistive element R is interrupted after the resistance of resistive element R has reached a determined value for which signal $V_{COMP}$ switches from "0" to "1". The resistance of resistive element R after the switching is thus controlled.

Figure 12:
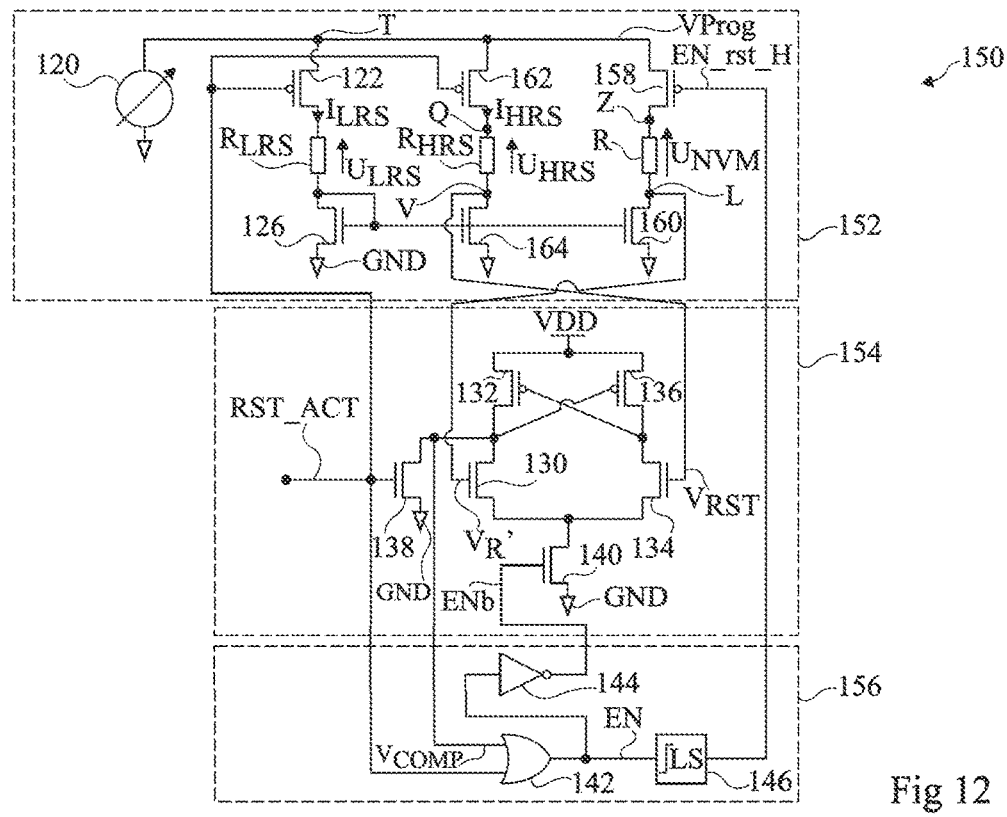
FIGS. 12 and 13 are partial electric diagrams of embodiments of a device for deleting from a memory cell of a resistive memory.

FIG. 12 shows an embodiment of a device 150 for deleting from a resistive element R.

Delete device 150 comprises a programming circuit 152, a circuit for detecting the end of a delete operation 154, and a logic feedback circuit 156. Detection circuit 154 may be identical to previously-described circuit 116, with the difference that signal SET_ACT is replaced with a binary signal RST_ACT. Logic circuit 156 may be identical to previously-described logic circuit 118, with the difference that signal SET_ACT is replaced with a binary signal RST_ACT and in that signal EN_set_H is replaced with a binary signal EN_rst_H.

Programming circuit 152 comprises certain elements of previously-described programming circuit 114. Programming circuit 152 comprises, in particular, circuit 120 for supplying voltage VProg to node T. Programming circuit 152 comprises a switch 158 controlled by binary signal EN_rst_H between node T and node Z. Switch 158 may correspond to a P-channel MOS transistor having its source connected to node T, having its drain connected to node Z, and having its gate receiving signal EN_rst_H.

Programming circuit 152 comprises an N-channel MOS transistor 160 having its drain connected to node L, having its source connected to ground GND, and having its gate connected to the gate of MOS transistor 126. Call $V_R'$ the voltage between node L and ground GND.

Programming circuit 152 further comprises a reference resistor $R_{HRS}$ between nodes Q and V and a switch 162 controlled by binary signal RST_ACT between node T and node Q. Switch 162 may correspond to a P-channel MOS transistor having its source connected to node T, having its drain connected to node Q, and having its gate receiving signal RST_ACT. In the present embodiment, resistance $R_{HRS}$ is substantially equal to resistance Roff desired for resistive element R. Resistor $R_{HRS}$ may be formed by a polysilicon track. Call $U_{HRS}$ the voltage across resistor $R_{HRS}$ and $V_{RST}$ the voltage between node V and ground GND. Programming circuit 152 further comprises an N-channel MOS transistor 164 having its drain connected to node V, having its source connected to ground GND, and having its gate connected to the gate of transistor 126. Node V is connected to the gate of transistor 134 and node L is connected to the gate of transistor 130.

The gate width of transistor 160 may be larger than the gate width of transistor 126.

Delete device 150 operates as follows. Before the beginning of a delete operation, signal RST_ACT is at "1". Transistor 138 is thus conductive, which maintains signal $V_{COMP}$ at "0". Further, transistors 122 and 162 are off. No current flows through resistors $R_{LRS}$ and $R_{HRS}$. Signal EN is at "1" and signal ENb is at "0". Transistor 140 is thus off. Signal EN_rst_H is at "1". Transistor 158 is thus off. No current flows through resistive element R.

At the beginning of a delete operation, signal RST_ACT is set to "0". Transistors 122 and 162 thus become conductive. Since signal $V_{COMP}$ is at "0", signal EN switches to "0" and signal ENb switches to "1". Transistor 140 thus becomes conductive. Signal EN_rst_H switches to "0". Transistor 158 thus turns on. Circuit 120 supplies programming voltage VProg. It results in the flowing of a current $I_{LRS}$ through resistor $R_{LRS}$. Current $I_{LRS}$, copied by the current mirror, possibly with a multiplication factor greater than 1, flows through resistor element R and through resistor $R_{HRS}$. Since the resistance of resistive element is of low level, voltage $U_{NVM}$ across resistive element R is smaller than voltage $U_{HRS}$ across resistor $R_{HRS}$ and voltage $V_R'$ is greater than voltage $V_{RST}$. Transistor 130 is thus more conductive than transistor 134. Signal $V_{COMP}$ thus remains at "0", transistor 136 being conductive and transistor 132 being off.

When resistive element R switches, the resistance of resistive element R increases. When voltage $U_{NVM}$ becomes substantially equal to voltage $U_{HRS}$, voltage $V_R'$ becomes substantially equal to $V_{RST}$. Since the gate width of transistor 134 is larger than the gate width of transistor 130, transistor 134 is more conductive than transistor 130. This causes a switching of $V_{COMP}$ from state "0" to state "1", transistor 132 becoming conductive and transistor 136 turning off. Signal EN and signal EN_rst_H then switch from "0" to "1". Transistor 158 is then turned off, interrupting the current flow in resistive element R. Further, signal ENb switches from "1" to "0", thus turning off transistor 140.

According to another embodiment, the gate width of transistor 134 may not be larger than the gate width of transistor 130. In this case, reference resistance $R_{HRS}$ is smaller than the desired resistance Roff. When resistive element R switches, the resistance of resistive element R increases from Ron to Roff. When the resistance of resistive element R becomes greater than resistance $R_{HRS}$, voltage $U_{NVM}$ becomes greater than voltage $U_{HRS}$ and voltage $V_R'$ becomes smaller than $V_{RST}$. Transistor 134 is more conductive than transistor 130. This causes a switching of $V_{COMP}$ from "0" to "1".

For each memory cell, the current flowing through the memory cell is interrupted as soon as the memory cell has switched. The memory cell lifetime is advantageously preserved since the memory cell is not submitted longer than necessary to the voltage and to the current enabling it to switch. Further, the memory cell power consumption during a delete operation is decreased. Further, in the present embodiment, the current flow in resistive element R is interrupted after the resistance of resistive element R reaches a determined value for which signal $V_{COMP}$ switches from "0" to "1". The resistance of resistive element R after the switching is thus controlled.

Figure 13:
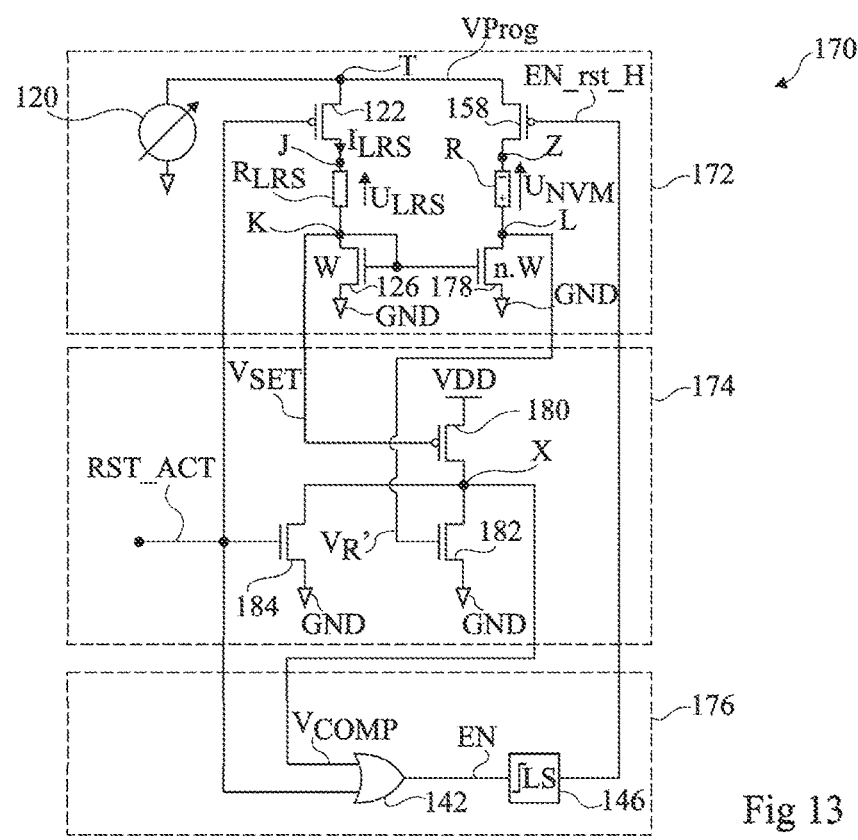

FIG. 13 shows another embodiment of a device 170 for deleting from a resistive element R.

Delete device 170 comprises a programming circuit 172, a circuit for detecting the end of a delete operation 174, and a logic feedback circuit 176. Programming circuit 172 comprises transistors 122 and 126 and resistor $R_{LRS}$ of circuit 114 previously described in relation with FIG. 11. Programming circuit 172 further comprises transistor 158 of circuit 152 previously described in relation with FIG. 12. Resistive element R is connected in the same way as for circuit 152. Programming circuit 172 further comprises an N-channel MOS transistor 178 having its source connected to ground GND, having its gate connected to the gate of transistor 126, and having its drain connected to node L. The gate width of transistor 178 may be larger, for example, by a factor n greater than 1, than the gate width of transistor 126. Logic circuit 176 may comprise previously-described logic block 142 and level conversion circuit 146 of logic circuit 156.

Detection circuit 174 comprises a P-channel MOS transistor 180 having its source connected to the source of reference potential VDD, having its gate connected to node K and receiving voltage $V_{SET}$, and having its drain connected to a node X. Detection circuit 174 comprises an N-channel MOS transistor 182 having its source connected to ground GND, having its gate connected to node L and receiving voltage $V_R'$, and having its drain connected to node X. Node X delivers signal $V_{COMP}$ received by "OR" logic gate 142. Detection circuit 174 comprises an N-channel MOS transistor 184 having its source connected to ground GND, having its gate receiving signal RST_ACT, and having its drain connected to node X.

Delete device 170 operates as follows. Before the beginning of a delete operation, signal RST_ACT is at "1". Transistor 122 is thus off. No current flows through resistor $R_{LRS}$. Transistor 184 is conductive and signal $V_{COMP}$ is at "0". Signal EN is at "1" and signal EN_rst_H is at "1". Transistor 158 is thus off. No current flows through resistive element R.

At the beginning of a delete operation, signal RST_ACT is set to "0". Transistor 122 thus becomes conductive and transistor 184 is turned off. Since signal $V_{COMP}$ is at "0", signal EN and signal EN_rst_H switch to "0". Transistor 158 thus becomes conductive. Circuit 120 supplies programming voltage VProg. It results in the flowing of a current $I_{LRS}$ through resistor $R_{LRS}$. Current $I_{LRS}$ is copied by the current mirror and flows through resistive element R multiplied by multiplication factor n. Since the resistance of resistive element R initially has value Ron, voltage $U_{NVM}$ across resistive element R is in the order of n times voltage $U_{LRS}$ across resistor $R_{LRS}$. Transistors 180 and 182 are sized so that in this configuration, transistor 182 is more conductive than transistor 180. Signal $V_{COMP}$ thus remains at "0".

When resistive element R switches, the resistance of resistive element R increases from Ron to Roff. Voltage $U_{NVM}$ increases and signal $V_R$' decreases. Transistor 180 is more conductive than transistor 182. This causes a switching of $V_{COMP}$ from "0" to "1". Signal EN and signal EN_rst_H then switch from "0" to "1". Transistor 158 is then turned off, interrupting the current flow through resistive element R and thus the delete operation.

For each memory cell, the current flowing through the memory cell is interrupted as soon as the memory cell has switched. The memory cell lifetime is advantageously preserved since the memory cell is not submitted longer than necessary to the voltage and to the current enabling it to switch. Further, the memory cell power consumption during a delete operation is decreased. Further, in the present embodiment, the current flow through resistive element R is interrupted after the resistance of resistive element R has reached a determined resistance value for which signal $V_{COMP}$ switches from "0" to "1". The resistance of resistive element R after the switching is thus controlled.

Figure 14:
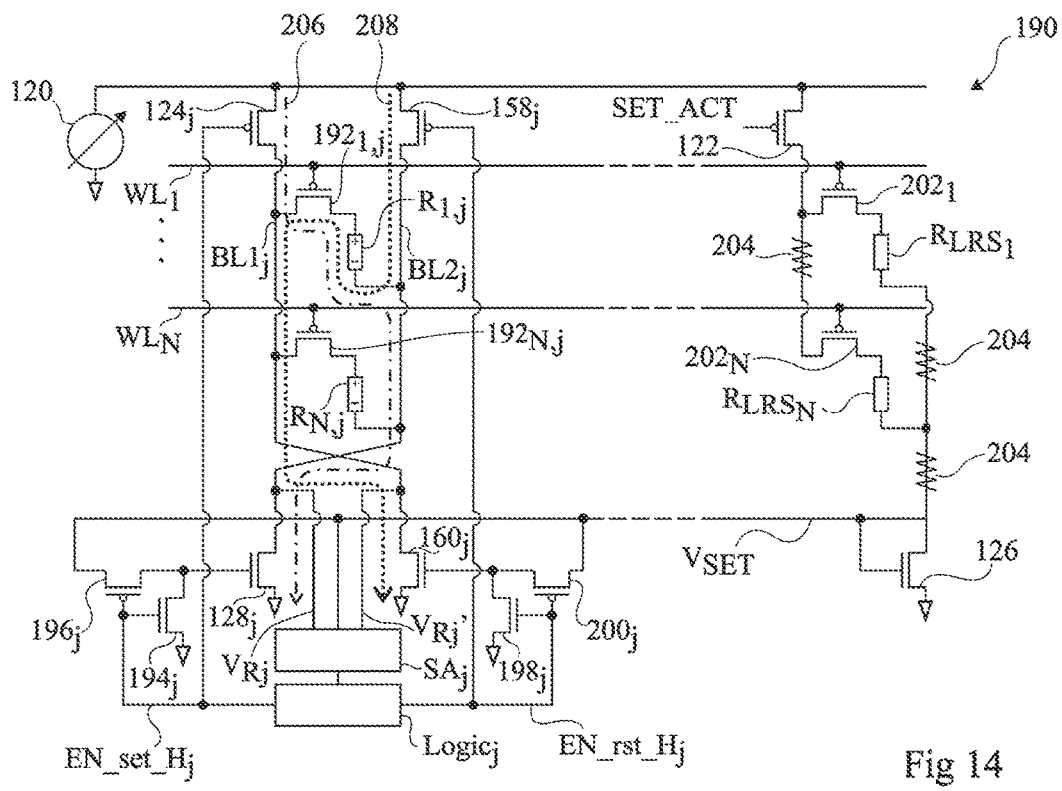
FIGS. 14 to 16 are electric diagrams of embodiments of a device for writing into a plurality of memory cells of a resistive memory.

FIG. 14 shows an embodiment of a memory 190 comprising a write device having an operation which may be similar to what has previously described for write device 110 shown in FIG. 11. Memory 190 comprises an array of resistive elements $R_{i,j}$ arranged in N rows and M columns, where i varies from 1 to N and j varies from 1 to M. FIG. 14 shows the resistive elements of the first row and of the last row for column "j". Further, the elements of memory 190 identical to the elements of the write or delete device previously described in relation with FIGS. 11 to 13 are designated with the same reference numerals, to which an index may be added to indicate that the element is repeated for each row "i" and/or for each column "j".

As an example, two resistive elements $R_{1,j}$ and $R_{N,j}$ of column j are shown in FIG. 14. Each resistive element $R_{i,j}$ comprises a first terminal (+) and a second terminal (−). Terminal (+) is connected to the source of a P-channel MOS transistor $192_{i,j}$. For each row "i", the gate of each transistor $192_{i,j}$ in the row is connected to a word line $WL_i$. For each column "j", the source of each transistor $192_{i,j}$ in the column is connected to a first bit line $BL1_j$ and terminal (−) of each resistive element $R_{i,j}$ in the column is connected to a second bit line $BL2_j$. Bit line $BL1_j$ is connected to the drain of transistor $124_j$ and to the drain of transistor $160_j$. Bit line $BL2_j$ is connected to the drain of transistor $158_j$ and to the drain of transistor $128_j$.

Memory 190 comprises a circuit for detecting the end of a write and/or delete operation $SA_j$ which is connected to bit lines $BL1_j$ and $BL2_j$ and to the gate of transistor 126. The operation of circuit $SA_j$ may be similar to that of previously described circuit 116 or 174 for detecting the end of a write operation. Memory 190 comprises a logic circuit $Logic_j$ which is connected to circuit $SA_j$ and which provides signals EN_set_$H_j$ and EN_rst_$H_j$. The operation of circuit $Logic_j$ may be similar to that of previously-described logic circuit 118 or 176.

Memory 190 further comprises an N-channel MOS transistor $194_j$ having its source connected to ground GND, having its drain connected to the gate of transistor $128_j$, and having its gate receiving signal EN_set_$H_j$. Memory 190 further comprises a P-channel MOS transistor $196_j$ having its source connected to the gate of transistor 126, having its drain connected to the gate of transistor $128_j$, and having its gate receiving signal EN_set_$H_j$. Memory 190 further comprises an N-channel MOS transistor $198_j$ having its source connected to ground GND, having its drain connected to the gate of transistor $160_j$, and having its gate receiving signal EN_rst_$H_j$. Memory 190 further comprises a P-channel MOS transistor $200_j$ having its source connected to the gate of transistor 126, having its drain connected to the gate of transistor $160_j$, and having its gate receiving signal EN_rst_$H_j$.

In the embodiment shown in FIG. 14, a reference resistor $R_{LRSi}$ and a P-channel MOS transistor $202_i$ are provided for each row "i". The gate of transistor $202_i$ is connected to word line $WL_i$ and the drain of transistor $202_i$ is connected to a first terminal of resistor $R_{LRSi}$. For the first row, the source of transistor $202_1$ is connected to the drain of transistor 122. For the other rows, the source of transistor $202_i$ of the row is connected to the source of transistor $202_{i-1}$ of the previous row. For the last row, the second terminal of resistor $R_{LRSN}$ is connected to the drain of transistor 126. For the other rows, the second terminal of resistor $R_{LRSi}$ is connected to the second terminal of resistor $R_{LRSi+1}$ of the next row. FIG. 14 shows parasitic resistors 204 which are substantially homogeneously distributed on the conductive tracks connecting switches $202_i$.

Memory 190 operates as follows. The resistive element $R_{i,j}$ where a write or delete operation should be performed is selected by the grounding of word line $WL_i$ so that transistor $192_{i,j}$ becomes conductive, the other word lines being maintained at high potential VDD. Further, transistor 122 is conductive so that a current flows through the resistor $R_{LRSi}$ of the same row as the selected resistive element $R_{i,j}$.

For an operation of writing into resistive element $R_{i,j}$ of column "j", signal EN_set_$H_j$ is set to "0" and signal EN_rst_$H_j$ is set to "1". Transistor $196_j$ is thus conductive and transistor $194_j$ is off. A current can thus flow through transistor $128_j$. Transistor $198_j$ is conductive and transistor $200_j$ is off. Transistor $160_j$ is thus off and no current can flow therethrough. Thereby, during the write operation, a current successively flows through transistor $124_j$, transistor $192_{i,j}$, resistive element $R_{i,j}$, from terminal (+) to terminal (−), and through transistor $128_j$. The current path is shown by a stripe-dot line 206.

For an operation of deleting resistive element $R_{i,j}$ of column "j", signal EN_set_$H_j$ is set to "1" and signal EN_rst_$H_j$ is set to "0". Transistor $200_j$ is thus conductive and transistor $198_j$ is off. A current can thus flow through transistor $160_j$. Transistor $194_j$ is conductive and transistor $196_j$ is off. Transistor $128_j$ is thus off and no current can flow therethrough. Thereby, during the delete operation, a current successively flows through transistor $158_j$, through resistive element $R_{i,j}$, from terminal (−) to terminal (+), through transistor $192_{i,j}$, and through transistor $160_j$. The current path is shown by a dotted line 208.

The arrangement of resistors $R_{LRSi}$ results in that the parasitic resistances seen by current $I_{LRS}$ flowing through resistor $R_{LRSi}$ are substantially the same whatever the selected resistive element $R_{i,j}$.

Figure 15:
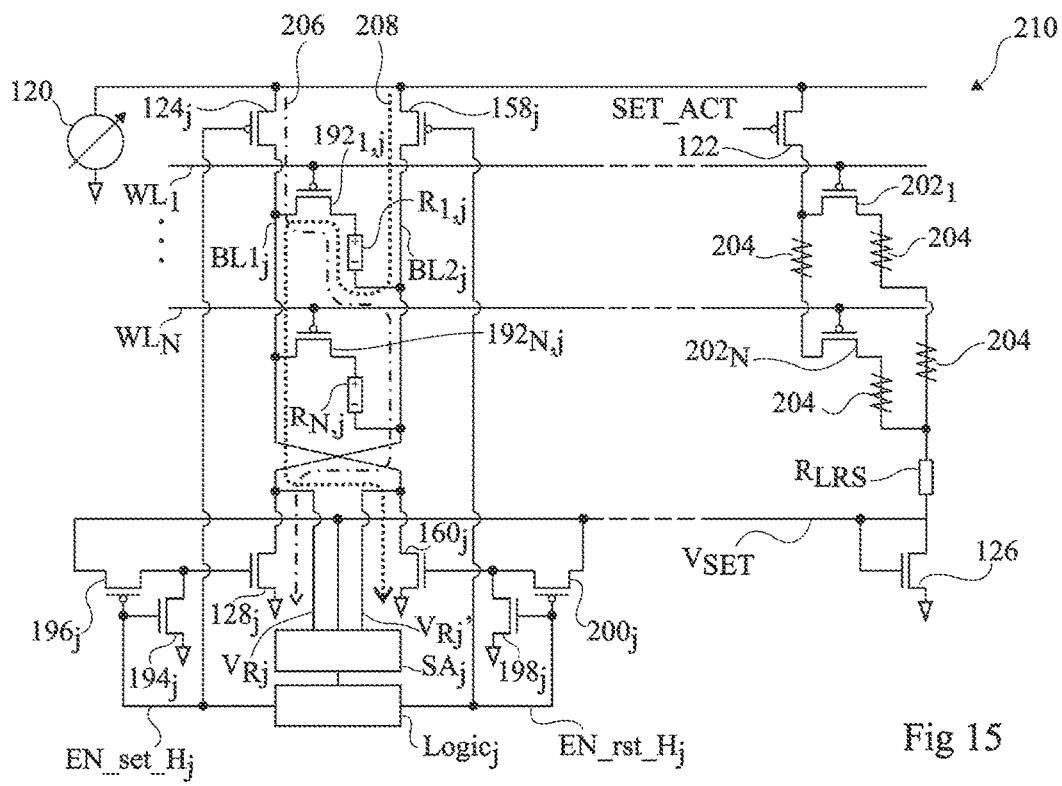

FIG. 15 shows another embodiment of a memory 210. Memory 210 comprises all the elements of memory 190, with the difference that a single resistor $R_{LRS}$ is present and is used whatever the selected resistive element $R_{i,j}$. There thus advantageously is a surface area gain with respect to memory 190 and less variability on current $I_{LRS}$ since the same resistor $R_{LRS}$ is used. Further, the parasitic resistances seen by current $I_{LRS}$ crossing resistor $R_{LRS}$ are substantially the same whatever the selected resistive element $R_{i,j}$.

Figure 16:
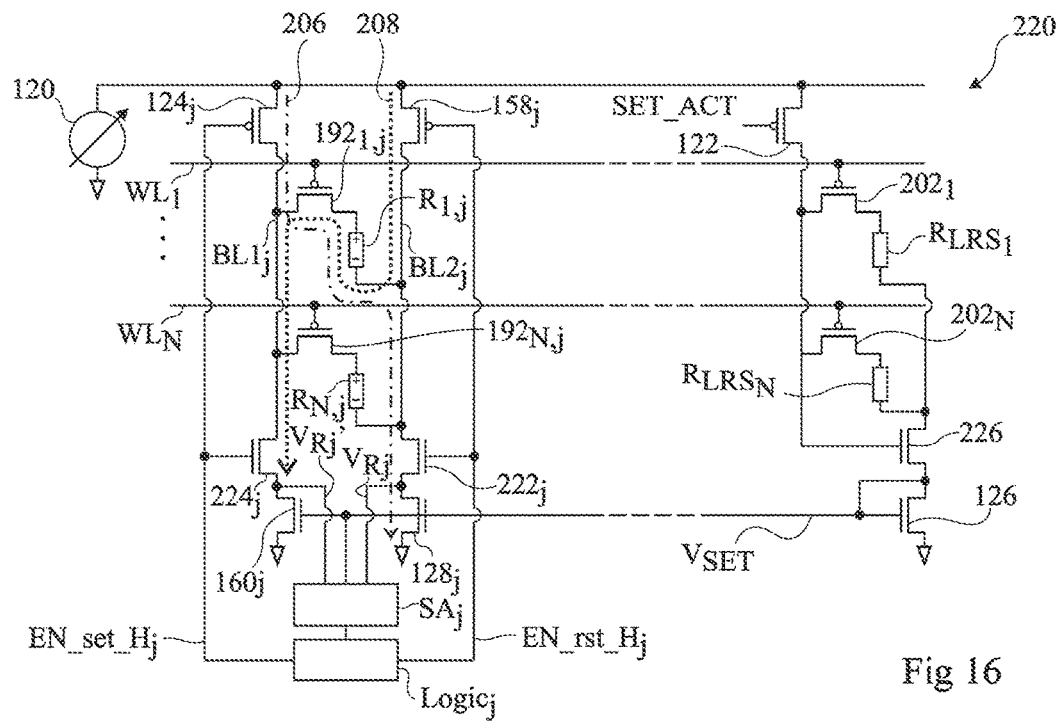

FIG. 16 shows another embodiment of a memory 220. Memory 220 comprises all the elements of memory 190 with the difference that transistors 194$_j$, 196$_j$, 198$_j$, and 200$_j$ are not present. Memory 220 comprises an N-channel MOS transistor 222$_j$ having its source connected to the drain of transistor 128$_j$ and to circuit SA$_j$, having its drain connected to line BL2$_j$, and having its gate receiving signal EN_rst_H$_j$. Memory 220 comprises an N-channel MOS transistor 224$_j$ having its source connected to the drain of transistor 160$_j$ and to circuit SA$_j$, having its drain connected to line BL1$_j$, and having its gate receiving signal EN_set_H$_j$. Memory 220 further comprises an N-channel MOS transistor 226 having its source connected to the drain of transistor 126, having its drain connected to a terminal of each resistor R$_{LRSi}$, and having its gate connected to the drain of transistor 122.

For an operation of writing into resistive element R$_{i,j}$ of column "j", signal EN_set_H$_j$ is set to "0" and signal EN_rst_H$_j$ is set to "1". Transistor 222$_j$ is thus conductive and transistor 224$_j$ is off. Thereby, the current flows as shown by stripe-dot line 206. For an operation of deleting from resistive element R$_{i,j}$ of column "j", signal EN_set_H$_j$ is set to "1" and signal EN_rst_H$_j$ is set to "0". Transistor 224$_j$ is thus conductive and transistor 222$_j$ is off. Thereby, the current flows as shown by dotted line 208.

In the embodiment shown in FIG. 16, memory 220 advantageously has a simplified structure with a decreased number of transistors with respect to memory 190.

Figure 17:
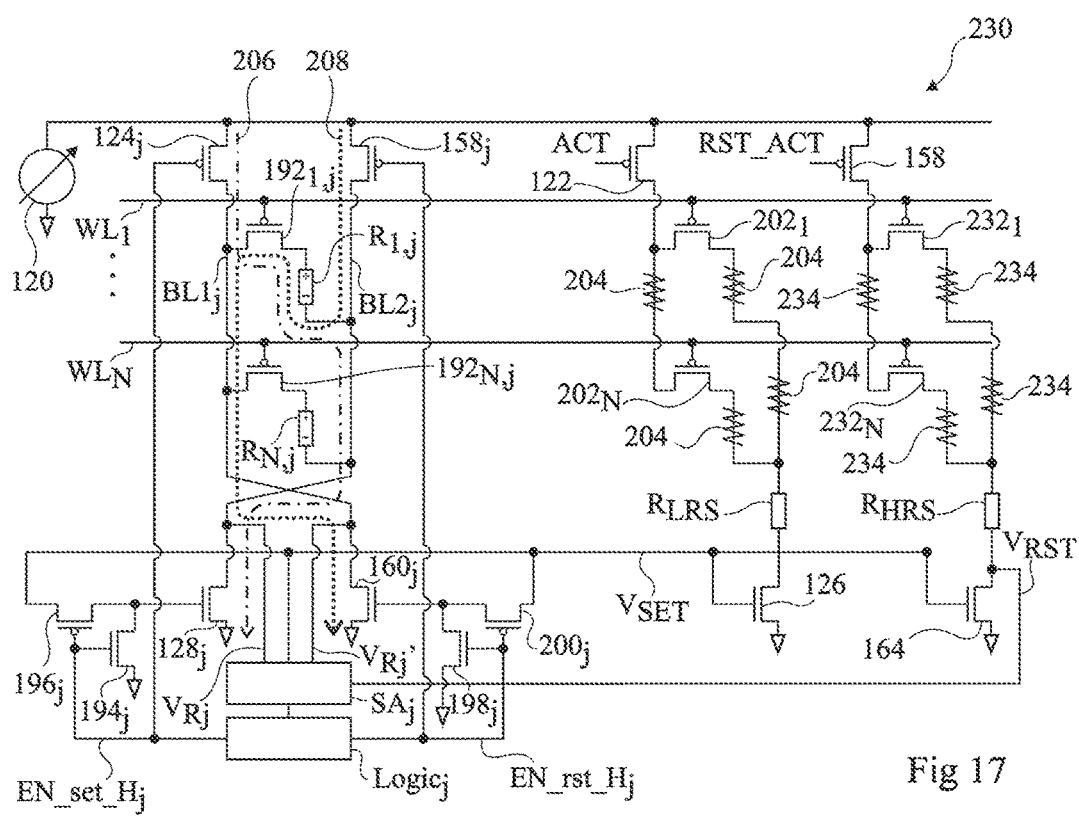
FIG. 17 is an electric diagram of an embodiment of a device for writing into and for deleting from a plurality of memory cells of a resistive memory.

FIG. 17 shows another embodiment of a memory 230 where delete device 170 previously described in relation with FIG. 13 may be used. Memory 230 has the same structure as memory 210 shown in FIG. 15. Memory 230 further comprises, of each row, a P-channel MOS transistor 232$_i$ having its gate connected to word line WL$_i$. For the first row, the source of transistor 232$_1$ is connected to the drain of transistor 158. For the other rows, the source of transistor 232$_i$ of the row is connected to the source of transistor 232$_{i-1}$ of the previous row. For the last row, the drain of transistor 232$_N$ is connected to a terminal of resistor R$_{HRS}$. For the other rows, the drain of transistor 232$_i$ of the row is connected to the drain of transistor 232$_{i+1}$ of the next row. FIG. 17 shows parasitic resistors 234 which are substantially homogeneously distributed on the conductive tracks connecting switches 232$_i$. Of course, a resistor R$_{HRS}$ may be provided for each row similarly to what has been described for resistors R$_{LRSi}$ in FIG. 16. Detection circuit SA$_j$ is further connected to the drain of transistor 164. The operation of circuit SA$_j$ may be similar to that of previously described circuit 156 for detecting the end of a write operation.

Figure 18:
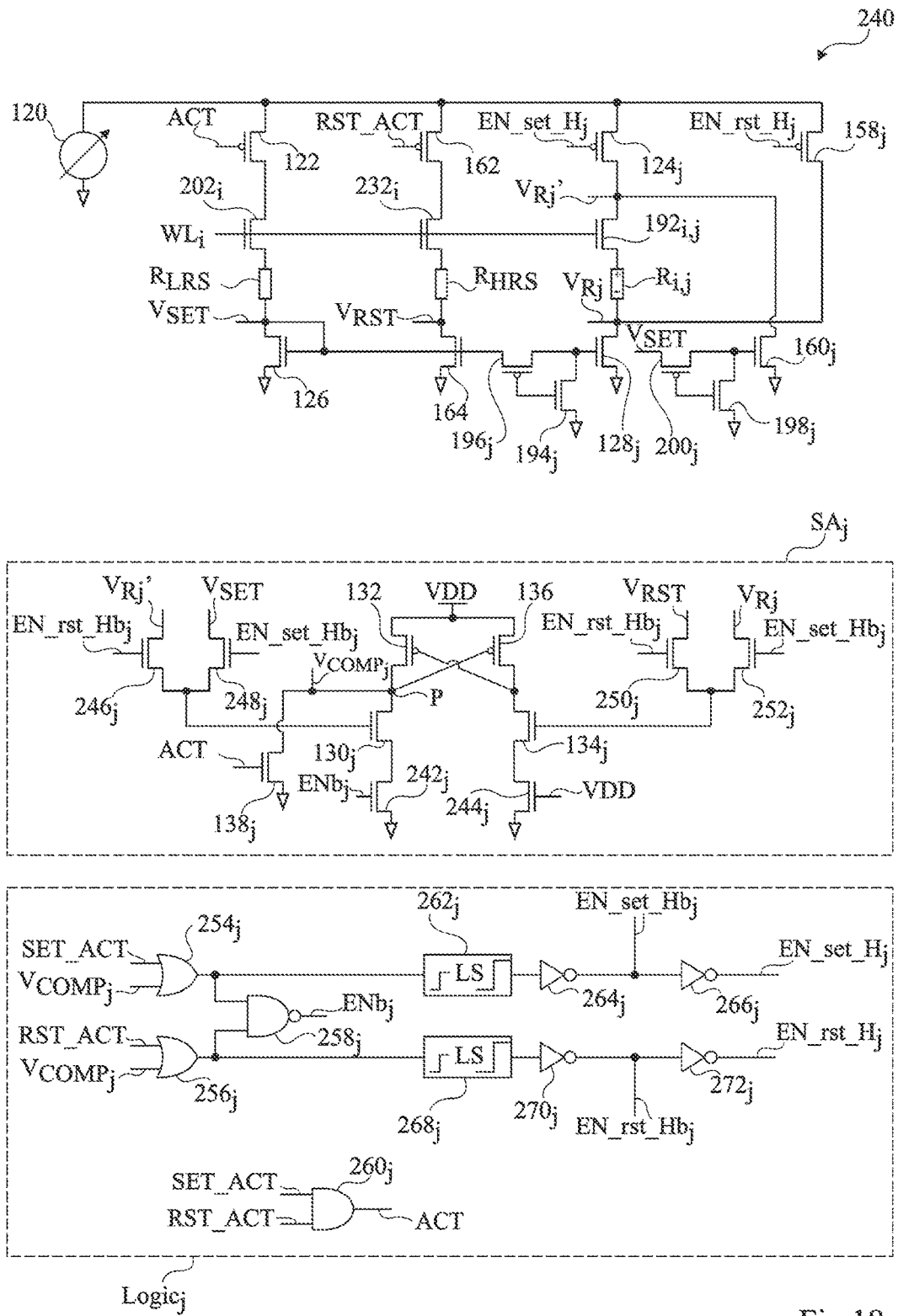
FIG. 18 is a more detailed electric diagram of an embodiment of a device for writing into and for deleting from memory cells of a resistive memory.

FIG. 18 shows a more detailed embodiment of a write and delete device 240 capable of being used with memory 230 of FIG. 17. The elements common with write device 110 shown in FIG. 11 and delete device 150 shown in FIG. 12 are designated with the same reference numerals, to which an index may be added to indicate that the element is repeated for each row "i" and/or for each column "j".

The gate of transistor 122 receives a signal ACT and the gate of transistor 162 receives signal RST_ACT.

Circuit SA$_j$ for detecting the end of a write and/or delete operation comprises all the elements of circuit 154, with the difference that transistor 140 is replaced with two N-channel MOS transistors 242$_j$, 244$j$. The drain of transistor 242$_j$ is connected to the source of transistor 130$_j$. The source of transistor 242$_j$ is connected to ground GND and the gate of transistor 242$_j$ receives signal ENb$_j$. The drain of transistor 244$_j$ is connected to the source of transistor 134$_j$. The source of transistor 244$_j$ is connected to ground GND and the gate of transistor 244$_j$ receives high reference potential VDD. Transistor 244$_j$ is thus conductive.

Circuit SA$_j$ further comprises an N-channel MOS transistor 246$_j$ having its drain receiving signal V$_{Rj}$' and having its gate receiving signal EN_rst_Hb$_j$. Circuit SA$_j$ further comprises an N-channel MOS transistor 248$_j$ having its drain receiving signal V$_{SET}$ and having its gate receiving signal EN_set_Hb$_j$. The sources of transistors 246$_j$ and 248$_j$ are connected to the gate of transistor 130$_j$. Circuit SA$_j$ further comprises an N-channel MOS transistor 250$_j$ having its drain receiving signal V$_{RST}$ and having its gate receiving signal EN_rst_Hb$_j$. Circuit SA$_j$ further comprises an N-channel MOS transistor 252$_j$ having its drain receiving signal V$_{Rj}$ and having its gate receiving signal EN_set_Hb$_j$. The sources of transistors 250$_j$ and 252$_j$ are connected to the gate of transistor 134$_j$.

The control of the write and read operations is performed by binary signals SET_ACT and RST_ACT. Logic circuit Logic$_j$ comprises four logic blocks 254$_j$, 256$_j$, 258$_j$, and 260$_j$. Block 254$_j$ carries out the "OR" logic function and receives signals SET_ACT and V$_{COMPj}$. Block 256$_j$ carries out the "OR" logic function and receives signals RST_ACT and V$_{COMPj}$. Block 258$_j$ carries out the "NAND" logic function, receives the outputs of blocks 254$_j$ and 256$_j$, and outputs signal ENb$_j$. Block 260$_j$ carries out the "AND" logic function, receives signals SET_ACT and RST_ACT, and outputs signal ACT.

Logic circuit Logic$_j$ comprises a level conversion circuit 262$_j$ receiving the output of block 254$_j$. The output of level conversion circuit 262$_j$ drives an inverter 264$_j$ which outputs signal EN_set_Hb$_j$. Signal EN_set_Hb$_j$ drives an inverter 266$_j$ which outputs signal EN_set_H$_j$. Logic circuit Logic$_j$ comprises a level conversion circuit 268$_j$ receiving the output of block 256$_j$. The output of level conversion circuit 268$_j$ drives an inverter 270$_j$ which outputs signal EN_rst_Hb$_j$. Signal EN_rst_Hb$_j$ drives an inverter 272$_j$ which outputs signal EN_rst_H$_j$.

Signals SET_ACT and RST_ACT are at "1" by default. Signal ACT thus is at "1". Transistor 138 is thus conductive, which maintains signal V$_{COMPj}$ at "0". Further, transistors 122, 162 are off. No current flows through resistors R$_{LRS}$ and R$_{HRS}$. Signal ENb$_j$ is at "0". Transistor 242$_j$ is thus off. Signals EN_set_Hb$_j$ and EN_rst_Hb$_j$ are at "0". Transistors 246$_j$, 248$_j$, 250$_j$, and 252$_j$ are thus off. Signals EN_set_H$_j$ and EN_rst_H$_j$ are at "1", transistors 124$_j$ and 158$_j$ are thus off. No current flows through resistive element R$_{i,j}$. Signals SET_ACT and RST_ACT are identical for all the columns in the array.

To perform an operation of writing into resistive element R$_{i,j}$ of column "j", signal SET_ACT is set to "0", signal RST_ACT remaining at "1". Signal ACT thus switches to "0". Transistor 138$_j$ is thus turned off and transistor 122 becomes conductive. Further, signal ENb$_j$ switches to "0". Transistor 242$_j$ thus turns on. Signal EN_set_H$_j$ switches to "0". Transistor 124$_j$ thus becomes conductive. Signal EN_set_Hb$_j$ switches to "1" while signal EN_rst_Hb$_j$ remains at "0". The gate of transistor 130$_j$ receives signal V$_{SET}$ and the gate of transistor 134$_j$ receives signal V$_{Rj}$. Circuit SA$_j$ then operates like end-of-writing detection circuit 116 previously-described in relation with FIG. 11.

To perform an operation of deleting from resistive element R$_{i,j}$ of column "j", signal RST_ACT is set to "0", signal SET_ACT remaining at "1". Signal ACT thus switches to "0". Transistor 138$_j$ is thus turned off and transistor 122 becomes conductive. Further, signal ENb$_j$ switches to "0". Transistor 242$_j$ thus turns on. Signal EN_rst_Hj switches to "0". Transistor 124$_j$ thus becomes conductive. Signal EN_rst_Hb$_j$ switches to "1" while signal EN_set_Hb$_j$ remains at "0". The gate of transistor 130$_j$ receives signal V$_{Rj}$' and the gate of transistor 134$_j$ receives signal V$_{RST}$. Circuit SA$_j$ then operates like end-of-deleting detection circuit 154 previously-described in relation with FIG. 12.

Specific embodiments have been described. Various alterations, modifications, and improvements will occur to those skilled in the art. In particular, the N-channel MOS transistors may be replaced with P-channel MOS transistors and the P-channel MOS transistors may be replaced with N-channel MOS transistors by adapting the control signals of these transistors.

Further, although the previously-described embodiments relate to bipolar memory cells for which the polarity of the voltage applied across the memory cell is inverted between a write operation and a delete operation, it should be clear that these embodiments may be adapted to unipolar memory cells for which the polarity of the voltage applied across the memory cell is the same for a write operation and a delete operation, only the amplitude range of the applied voltage being different between a write operation and a delete operation.

Further, although in the embodiments previously described in relation with FIGS. 11 to 18, each memory cell comprises a resistive element series-connected with a switch, particularly a MOS transistor, these embodiments may be implemented with other types of memory cells. As an example, each memory cell may comprise a diode series-connected with the resistive element.

The invention claimed is:

1. A resistive memory comprising resistive elements arranged in rows and in columns, the columns being distributed in groups of columns, the resistance of each resistive element being capable of alternating between a high value in a first range of values and a low value in a second range of values smaller than the high value, the memory further comprising a device for switching, for each group, the resistance of at least one resistive element selected from among the resistive elements of said group between the high and low values, the device comprising a first circuit connected to all columns, configured to provide a first increasing voltage ramp, that is a function linearly increasing with time, and configured to apply the first increasing voltage ramp across each selected resistive element while the selected resistive element is at the high value or at the low value, the device further comprising, for each group, a second circuit configured to detect the switching of the resistance of the selected resistive element, the device further comprising, for each group, a third circuit configured to interrupt a current flowing through the selected resistive element of said group on detection of the switching and the device further comprising a fourth circuit configured to supply a second increasing voltage ramp, that is a function linearly increasing with time, the second circuit being configured to compare the second increasing voltage ramp with a voltage which varies according to the resistance of the selected resistive element, wherein the voltage is proportional to the second voltage ramp with a proportionality factor which varies according to the resistance of the selected resistive element.

2. The resistive memory of claim 1, wherein the second circuit is configured to detect that the difference between the second voltage ramp and the voltage changes sign.

3. The resistive memory of claim 1, comprising a fifth circuit for supplying a third increasing voltage ramp and a voltage divider comprising, in series, at least one resistive component and the selected resistive element, the third voltage ramp being applied across the voltage divider, the voltage being measured at a node of the voltage divider between the resistive component and the selected resistive element.

4. The resistive memory of claim 1, wherein the fourth circuit comprises additional resistive elements assembled in series and in parallel.

5. The resistive memory of claim 1, wherein the second circuit comprises a comparator receiving the second voltage ramp and the voltage and providing a binary signal which depends on the sign of the difference between the second voltage ramp and the voltage.

6. The resistive memory of claim 5, comprising a fifth circuit for supplying a third increasing voltage ramp and a voltage divider comprising, in series, at least one resistive component and the selected resistive element, the third voltage ramp being applied across the voltage divider, the voltage being measured at a node of the voltage divider between the resistive component and the selected resistive element, wherein the voltage divider further comprises a switch controlled by the binary signal or a signal derived from the binary signal.

7. A method of controlling a resistive memory comprising resistive elements arranged in rows and in columns, the columns being distributed in groups of columns, the resistance of each resistive element being capable of alternating between a high value in a first range of values and a low value in a second range of values smaller than the high value, for the switching, for each group, of the resistance of at least one resistive element selected from among the resistive elements of said group between the high and low values, the method comprising the steps of:
    applying to all columns an increasing voltage ramp, that is a function linearly increasing with time, across each selected resistive element while the selected resistive element is in the high value or in the low value;
    detecting, for each group, the switching of the resistance of the selected resistive element of said group;
    interrupting, for each group, a current flowing through the selected resistive element of said group on detection of the switching;
    supplying a second increasing voltage ramp, that is a function linearly increasing with time; and
    comparing the second increasing voltage ramp with a voltage which varies according to the resistance of the selected resistive element;
    wherein the voltage is proportional to the second voltage ramp with a proportionality factor which varies according to the resistance of the selected resistive element.

8. The method of claim 7, comprising detecting that the difference between the second voltage ramp and the voltage changes sign.

9. A resistive memory comprising:
    resistive elements arranged in rows and in columns, the columns being distributed in groups of columns, the resistance of each resistive element alternating between a high value in a first range of values and a low value in a second range of values smaller than the high value;
    a device for switching, for each group of columns, the resistance of at least one of the resistive elements selected from among the resistive elements of said group between the high and low values, the device comprising:
        a first circuit connected to all columns, configured to provide a first increasing voltage ramp, that is a function linearly increasing with time, and configured to apply the first increasing voltage ramp across each selected resistive element while the selected resistive element is at the high value or at the low value;

for each group, a second circuit configured to detect the switching of the resistance of the selected resistive element;

for each group, a third circuit configured to interrupt a current flowing through the selected resistive element of said group on detection of the switching; and a fourth circuit configured to supply a second increasing voltage ramp, the fourth circuit including a transistor and an assembly of additional resistive elements disposed in series and in parallel, wherein the transistor and the assembly of additional resistive elements are connected to a node, and wherein the second circuit compares the second increasing voltage ramp with a voltage which varies according to the resistance of the selected resistive element.

* * * * *